United States Patent
Mazda et al.

(10) Patent No.: US 7,466,194 B2
(45) Date of Patent: Dec. 16, 2008

(54) DC OFFSET MITIGATION IN A SINGLE-SUPPLY AMPLIFIER

(75) Inventors: Babak Mazda, Los Altos, CA (US); Rahul Shinkre, Cupertino, CA (US); Farzad Sahandiesfanjani, Santa Clara, CA (US); Maziar Sayyedi, Mountain View, CA (US); Krishna Prasad Sarangapani, Santa Clara, CA (US)

(73) Assignee: Cirrus Logic, Inc., Austin, TX (US)

( * ) Notice: Subject to any disclaimer, the term of this patent is extended or adjusted under 35 U.S.C. 154(b) by 67 days.

(21) Appl. No.: 11/737,616

(22) Filed: Apr. 19, 2007
(Under 37 CFR 1.47)

(65) Prior Publication Data

US 2008/0094135 A1    Apr. 24, 2008

Related U.S. Application Data

(60) Provisional application No. 60/802,031, filed on May 18, 2006.

(51) Int. Cl.
*H03F 1/02*    (2006.01)

(52) U.S. Cl. .......................... 330/9; 330/10; 330/251; 330/207 A

(58) Field of Classification Search ............ 330/9–10, 330/251, 207 A
See application file for complete search history.

(56) References Cited

U.S. PATENT DOCUMENTS

| 5,475,337 | A | 12/1995 | Tatsumi |
| 5,606,289 | A | 2/1997 | Williamson |
| 6,316,992 | B1 | 11/2001 | Miao et al. |
| 6,724,248 | B2 | 4/2004 | Llewellyn |
| 7,026,866 | B2 | 4/2006 | Llewellyn |
| 7,142,047 | B2 | 11/2006 | Sahandiesfanjani et al. |
| 7,230,481 | B2 * | 6/2007 | Hansen et al. ............ 330/51 |
| 2005/0083115 | A1 | 4/2005 | Risbo |

OTHER PUBLICATIONS

International Search Report dated Feb. 6, 2008, from related International Application No. PCT/US 07/12011.
Written Opinion dated Feb. 6, 2008, from related International Application No. PCT/US 07/12011.

* cited by examiner

*Primary Examiner*—Robert Pascal
*Assistant Examiner*—Hieu P Nguyen
(74) *Attorney, Agent, or Firm*—Weaver Austin Villeneuve & Sampson LLP

(57) ABSTRACT

An amplifier is described which includes a first loop including a first amplifier stage having an offset voltage associated therewith. An output stage includes two switching devices in a bridge configuration configured to be coupled between a supply voltage and ground. An output of the bridge configuration is configured to be coupled to a load. The first loop is characterized by a first gain. A decoupling capacitor is configured to be coupled to the load. A second loop which includes the first amplifier stage is configured to charge the decoupling capacitor to a first voltage generated with reference to the offset voltage before operation of the switching devices is enabled. The second loop is characterized by a second gain. The first and second gains are substantially the same such that when operation of the switching devices is enabled a second voltage at the output of the half-bridge configuration is substantially the same as the first voltage.

9 Claims, 1 Drawing Sheet

DC OFFSET MITIGATION IN A SINGLE-SUPPLY AMPLIFIER

RELATED APPLICATION DATA

The present application claims priority under 35 U.S.C. 119(e) to U.S. Provisional Patent Application No. 60/802,031 filed on May 18, 2006, the entire disclosure of which is incorporated herein by reference for all purposes.

BACKGROUND OF THE INVENTION

The present invention relates to the mitigation of DC offset voltage in amplifiers and, more specifically, to the use of such techniques in audio amplifiers to eliminate or reduce undesirable audible artifacts when amplification begins.

In virtually any amplification system, a standard design goal is the minimization of DC offset voltage. DC offset voltage is defined as a non-zero DC voltage observed at the amplifier output when zero DC voltage is applied to the input. In an audio amplifier, the DC offset voltage can appear suddenly at the output terminals (and thus at the speakers) at the instant the amplifier is energized or activated, producing an unpleasant thump or pop. This phenomenon is observed in both linear and switching amplifiers.

Minimization of DC offset voltage can be achieved by the use of carefully matched circuit elements, by adaptive (i.e., self-adjusting) mechanisms, or both. Some amplification systems are designed with relays between their output stages and the speakers that are open at the time the amplifier is energized and close only after a very slow acting continuous time servo loop has had sufficient time to null the output offset. The use of relays is costly, however, and can impact reliability as well. The slow acting servo loop also requires a time constant that is large (i.e., it must be significantly greater than the period of the lowest audio frequency being amplified) and is therefore difficult to integrate onto a silicon chip. Digital solutions to this problem have been effective, but are typically costly both in terms of economic costs as well as chip area.

It is therefore desirable to provide improved techniques for reducing or minimizing undesirable effects associated with DC offset in switching amplifiers.

SUMMARY OF THE INVENTION

According to various embodiments of the present invention, an amplifier is provided which includes a first loop including a first amplifier stage having an offset voltage associated therewith. An output stage includes two switching devices in a bridge configuration configured to be coupled between a supply voltage and ground. An output of the bridge configuration is configured to be coupled to a load. The first loop is characterized by a first gain. A decoupling capacitor is configured to be coupled to the load. A second loop which includes the first amplifier stage is configured to charge the decoupling capacitor to a first voltage generated with reference to the offset voltage before operation of the switching devices is enabled. The second loop is characterized by a second gain. The first and second gains are substantially the same such that when operation of the switching devices is enabled a second voltage at the output of the half-bridge configuration is substantially the same as the first voltage.

A further understanding of the nature and advantages of the present invention may be realized by reference to the remaining portions of the specification and the drawings.

DETAILED DESCRIPTION OF SPECIFIC EMBODIMENTS

Figure 1:
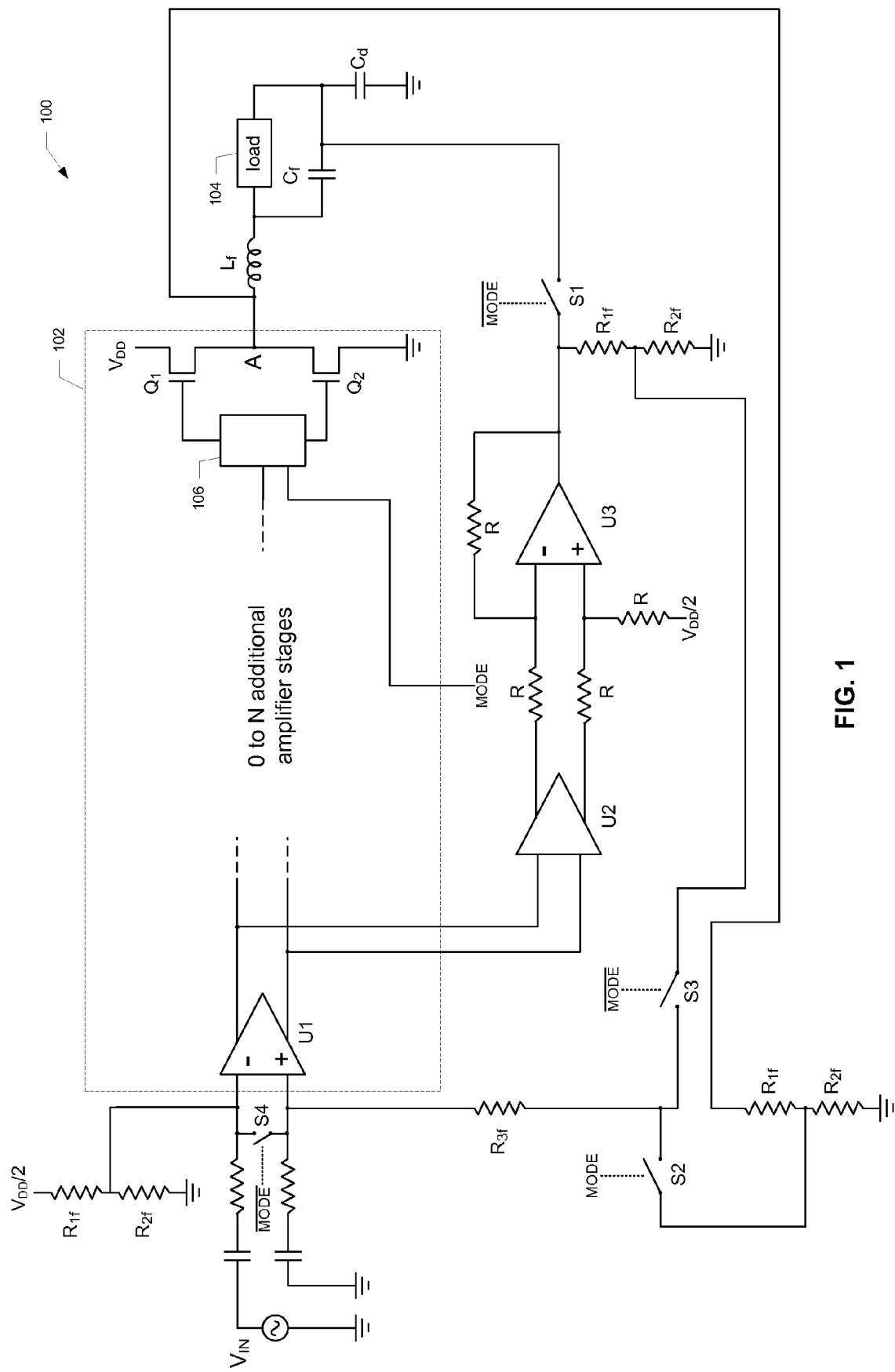
FIG. 1 is a simplified schematic of an amplifier implemented according to a specific embodiment of the invention

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

FIG. 1 is a simplified schematic of an amplifier 100 (e.g., an audio amplifier) implemented according to a specific embodiment of the invention. The details of the forward path of main amplifier circuitry 102 following first stage U1 are not shown because a wide variety of amplifier topologies are suitable for use with the present invention including, for example, both linear amplifiers (e.g., class AB, class B, class G, class H) and switching or digital amplifiers (e.g., class D amplifiers). Amplifiers implemented according to the invention may also have any number of stages in the main amplifier loop including only one, e.g., U1. In general, any application for which DC offset is problematic may employ the techniques described herein to mitigate the effects of DC offset. Therefore, the present invention should not be limited with reference to the exemplary implementation of FIG. 1.

As described above and without the technique of the present invention, if the voltage at node A is not exactly half of $V_{DD}$ when the power stage (i.e., $Q_1$ and $Q_2$ in a half-bridge configuration) is enabled (e.g., as a result of the input referred offset voltage), there will be undesired power dissipation at load 104 (e.g., an audible and unpleasant pop where load 104 is an audio speaker) due to the difference between the voltage at node A and the voltage at decoupling capacitor $C_d$. Therefore, according to a specific embodiment of the invention, prior to enabling the power stage, decoupling capacitor $C_d$ is charged up to $V_{DD}/2$ plus an additional voltage which is the input referred offset voltage ($V_{offset}$) with some gain applied to it. As will be described, the gain applied to $V_{offset}$ is intended to ensure that the voltage on $C_d$ closely matches the voltage at node A when switching begins, i.e., that there is little or no voltage difference across the load when the output stage is energized.

During power on (e.g., unmuting) of amplifier 100, $Q_1$ and $Q_2$ are initially kept off. This is represented in FIG. 1 by application of the signal MODE to gate driver circuitry 106. That is, when MODE is deasserted, driver circuitry 106 is off and no gate drive is provided to $Q_1$ and $Q_2$. It should be noted that this is merely one example of the manner in which the power stage of 102 may be kept off and, depending on the particular implementation of 102, a wide variety of suitable mechanisms for achieving this will be apparent to those of skill in the art.

Also during this mode, i.e., when MODE is deasserted, switch S2 is open while switches S1, S3, and S4 are closed (as represented by the complement of MODE). This opens up the main loop of amplifier 100 (i.e., the loop including all of circuitry 102) while completing a second loop including U1, U2, and U3. The gains of both loops, i.e., the main amplifier loop and this second loop (G1 and G2, respectively), are substantially the same and are determined in this example by the values of feedback resistors $R_{1f}$, $R_{2f}$, and $R_{3f}$. As described above, the purpose of the second loop is to charge up capacitor $C_d$ such that when the main loop is closed and switching begins, the voltage on $C_d$ matches the voltage at node A. Thus, special attention should be paid to closely matching the values of resistors $R_{1f}$ and $R_{2f}$ in each of the loops.

The charging of capacitor $C_d$ prior to enabling operation of the main amplifier loop will now be described. During this mode, switch S4 shorts the input of U1, the main contributor of the input referred offset voltage, $V_{offset}$, which then appears at the output of U1 and the input of buffer U2. Switch S3 completes the second loop and switch S1 connects the loop output to $C_d$. The second loop's gain, G2 (determined by the values of feedback resistors $R_{1f}$, $R_{2f}$, and $R_{3f}$) is applied to $V_{offset}$ such that the output of U3 (and therefore the voltage to which $C_d$ is charged) is given by $G2(V_{offset})+V_{DD}/2$.

After $C_d$ settles to this final value, switches S1, S3, and S4 are opened, and S2 is closed, completing the main amplifier loop and opening the second loop described above. In addition, switching of $Q_1$ and $Q_2$ is enabled (e.g., by enabling gate driver circuitry 106). Assuming that $V_{IN}$ is initially zero, the voltage at node A is given by $G1(V_{offset})+V_{DD}/2$. That is, because of the input referred offset, even with no input, the respective duty cycles of $Q_1$ and $Q_2$ will deviate from 50% by some amount which results in a corresponding deviation in the voltage at node A from the ideal $V_{DD}/2$. As will be understood, this deviation corresponds to $V_{offset}$ multiplied by the main loop gain. And because the gain of the main amplifier loop, i.e., G1, is substantially equal to the gain of the second loop including U2 and U3, i.e., G2, the voltage at node A when $Q_1$ and $Q_2$ commence switching will closely matches the voltage on $C_d$, thus resulting in little or no voltage across the load (e.g., speaker 104) when switching commences.

Embodiments of the present invention enjoy a number of advantages. For example, no complicated calibration scheme (e.g., those using a DAC) are required. That is, using the approach of the present invention, amplifiers may be designed which can tolerate whatever input referred offset voltage exists at the output. In addition, because the voltage on $C_d$ is preserved during operation, there is no undesirable artifact (e.g., a pop) when the amplifier is turned off (e.g., muted).

While the invention has been particularly shown and described with reference to specific embodiments thereof, it will be understood by those skilled in the art that changes in the form and details of the disclosed embodiments may be made without departing from the spirit or scope of the invention. For example, embodiments have been described herein in relating to audio amplification. It will be understood, however, that the present invention is more widely applicable and may be used in a wide variety of contexts to deal with the problem of DC offset.

In addition, embodiments of the invention may be implemented in a wide variety of contexts using a wide variety of technologies without departing from the scope of the invention. That is, embodiments of the invention may be implemented in processes and circuits which, in turn, may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., a SPICE netlist), semiconductor processes (e.g., CMOS, GaAs, SiGe, etc.), and device types (e.g., amplifier integrated circuits and the electronic systems in which they are employed) suitable for designing and manufacturing the processes and circuits described herein are within the scope of the invention.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An amplifier, comprising:
   a first loop including a first amplifier stage having an offset voltage associated therewith, and an output stage comprising two switching devices in a bridge configuration configured to be coupled between a supply voltage and ground, an output of the bridge configuration being configured to be coupled to a load, the first loop being characterized by a first gain;
   a decoupling capacitor configured to be coupled to the load; and
   a second loop including the first amplifier stage, the second loop being configured to charge the decoupling capacitor to a first voltage generated with reference to the offset voltage before operation of the switching devices is enabled, the second loop being characterized by a second gain, wherein the first and second gains are substantially the same such that when operation of the switching devices is enabled a second voltage at the output of the half-bridge configuration is substantially the same as the first voltage.

2. The amplifier of claim 1 wherein the first loop comprises a linear amplifier.

3. The amplifier of claim 2 wherein the linear amplifier comprises one of a class AB amplifier, a class B amplifier, class G amplifier, and a class H amplifier.

4. The amplifier of claim 1 wherein the first loop comprises a switching amplifier.

5. The amplifier of claim 4 wherein the switching amplifier comprises a class D amplifier.

6. The amplifier of claim 1 wherein the first loop comprises an audio amplifier and the load comprises a speaker.

7. The amplifier of claim 1 wherein the first loop comprises a single stage comprising the first amplifier stage.

8. The amplifier of claim 1 wherein the first loop comprises a plurality of stages including the first amplifier stage.

9. An electronic system comprising the amplifier of claim 1.

* * * * *